US009318165B2

United States Patent
Jung et al.

(10) Patent No.: US 9,318,165 B2
(45) Date of Patent: Apr. 19, 2016

(54) METHOD AND APPARATUS FOR LOW-LEVEL INPUT SENSE AMPLIFICATION

(71) Applicant: QUALCOMM Incorporated, San Diego, CA (US)

(72) Inventors: Chulmin Jung, San Diego, CA (US); Rui Li, San Diego, CA (US); Sei Seung Yoon, San Diego, CA (US); Gregory Ameriada Uvieghara, Murrieta, CA (US)

(73) Assignee: QUALCOMM Incorporated, San Diego, CA (US)

( * ) Notice: Subject to any disclaimer, the term of this patent is extended or adjusted under 35 U.S.C. 154(b) by 18 days.

(21) Appl. No.: 14/218,691

(22) Filed: Mar. 18, 2014

(65) Prior Publication Data

US 2015/0269978 A1    Sep. 24, 2015

(51) Int. Cl.
*H03F 3/45* (2006.01)
*G11C 7/06* (2006.01)
*G11C 17/16* (2006.01)
*G11C 17/18* (2006.01)

(52) U.S. Cl.
CPC ............... *G11C 7/062* (2013.01); *G11C 17/16* (2013.01); *G11C 17/18* (2013.01)

(58) Field of Classification Search
CPC .... G11C 7/062; G11C 17/16; H03F 3/45659; H03F 3/45183; H03F 3/4521
USPC .......................................................... 365/96
See application file for complete search history.

(56) References Cited

U.S. PATENT DOCUMENTS

| | | | | |
|---|---|---|---|---|
| 6,140,877 A | * | 10/2000 | Forbes | H03F 3/45479 330/258 |
| 6,472,939 B2 | * | 10/2002 | Forbes | H03F 3/45479 330/253 |
| 7,251,178 B2 | * | 7/2007 | Gogl et al. | 365/209 |
| 8,031,547 B2 | | 10/2011 | Fort et al. | |
| 8,310,308 B1 | * | 11/2012 | Ginsburg et al. | 330/258 |
| 2002/0053949 A1 | * | 5/2002 | Forbes | H03F 3/45479 330/253 |
| 2006/0050584 A1 | * | 3/2006 | Gogl et al. | 365/207 |
| 2010/0329061 A1 | | 12/2010 | Chung et al. | |
| 2013/0127536 A1 | | 5/2013 | Cavallaro et al. | |
| 2013/0169361 A1 | | 7/2013 | Killat | |
| 2014/0002043 A1 | | 1/2014 | Li et al. | |
| 2014/0010385 A1 | | 1/2014 | Mate | |
| 2014/0015550 A1 | | 1/2014 | Nezuka | |

OTHER PUBLICATIONS

International Search Report and Written Opinion—PCT/US2015/021053—ISA/EPO—Jun. 22, 2015.

* cited by examiner

*Primary Examiner* — Richard Elms
*Assistant Examiner* — Xiaochun L Chen
(74) *Attorney, Agent, or Firm* — Loza & Loza LLP

(57) ABSTRACT

A sense amplifier is disclosed that includes an amplifier circuit configured to receive, at an input, an input signal including an input level, the amplifier circuit configured to provide an amplified output signal including a gain with respect to the input level; and a feedback circuit coupled to receive the amplified output signal from the amplifier circuit, the feedback circuit configured to provide, at the input of the amplifier circuit, an adjusted version of the amplified output signal including a modified output magnitude based on common mode feedback.

18 Claims, 8 Drawing Sheets

METHOD AND APPARATUS FOR LOW-LEVEL INPUT SENSE AMPLIFICATION

BACKGROUND

1. Technical Field

The following relates generally to power saving for integrated circuits, and more specifically to a method and apparatus for low-level input sense amplification.

2. Background

A sense amplifier is an element in read circuitry for computer memory that makes up circuitry on an Integrated Circuit (IC) memory chip. Specifically, the sense amplifier is part of the read circuitry that is used during data read operations when data is read from the memory chip. One main function of the sense amplifier is for reading logic levels from a bit line that represents a data bit stored in a memory cell in the IC memory chip. In doing so, the sense amplifier may amplify small voltage swings to recognizable logic levels so data represented by them can be translated accurately at an output terminal of the IC memory chip.

Typically, one sense amplifier is used for each column of memory cells, which may lead to hundreds or thousands of identical sense amplifiers on a single IC memory chip. As such, improvement in sense amplifier design may be magnified by many multiples because of the large number of sense amplifiers used in each IC memory chip. One issue that may be addressed by an improved sense amplifier design is read disturbance effect for programmable memory devices that utilize fuses, where a bit value may be written to the programmable memory device by blowing a fuse to signify whether the bit value should be a logical one or zero. The read disturb effect is an unintentional programming phenomena that affects un-blown fuses during frequent read operations. Specifically, as a current through an un-blown fuse increases, the fuse resistance may also increase due to Electrical Migration (EM).

For example, the fuse resistance for an un-blown fuse, which usually amounts to tens of ohms during one read operation, can rise to a significantly higher level, such as tens of thousands of ohms after multiple, sequential read operations. This increase in resistance may ultimately result in the fuse being read incorrectly as a blown fuse, which is meant to represent a high resistance-value device. Thus, although no programming operation has been intentionally performed on an un-blown fuse, the un-blown fuse may be still be read as a blown fuse after a certain number of repeated read operations on the blow fuse because the resistance detected for the un-blown fuse will have increased to a level as high as that expected of a blown fuse. Avoiding or minimizing such read disturb effects is another constraint for e-fuse sense amplifier design.

Although numerous approaches have been taken to address these issues, existing solutions typically require additional complexities in the design and manufacturing of sense amplifiers. Thus, it would be desirable to be able to improve the efficiency of sense amplifiers while minimizing costs.

BRIEF DESCRIPTION OF THE DRAWINGS

These and other sample aspects of the disclosure will be described in the detailed description that follow, and in the accompanying drawings, wherein.

In accordance with common practice, some of the drawings may be simplified for clarity. Thus, the drawings may not depict all of the elements of a given apparatus (e.g., device) or method. Finally, like reference numerals may be used to denote like features throughout the specification and figures.

SUMMARY

Figure 1:
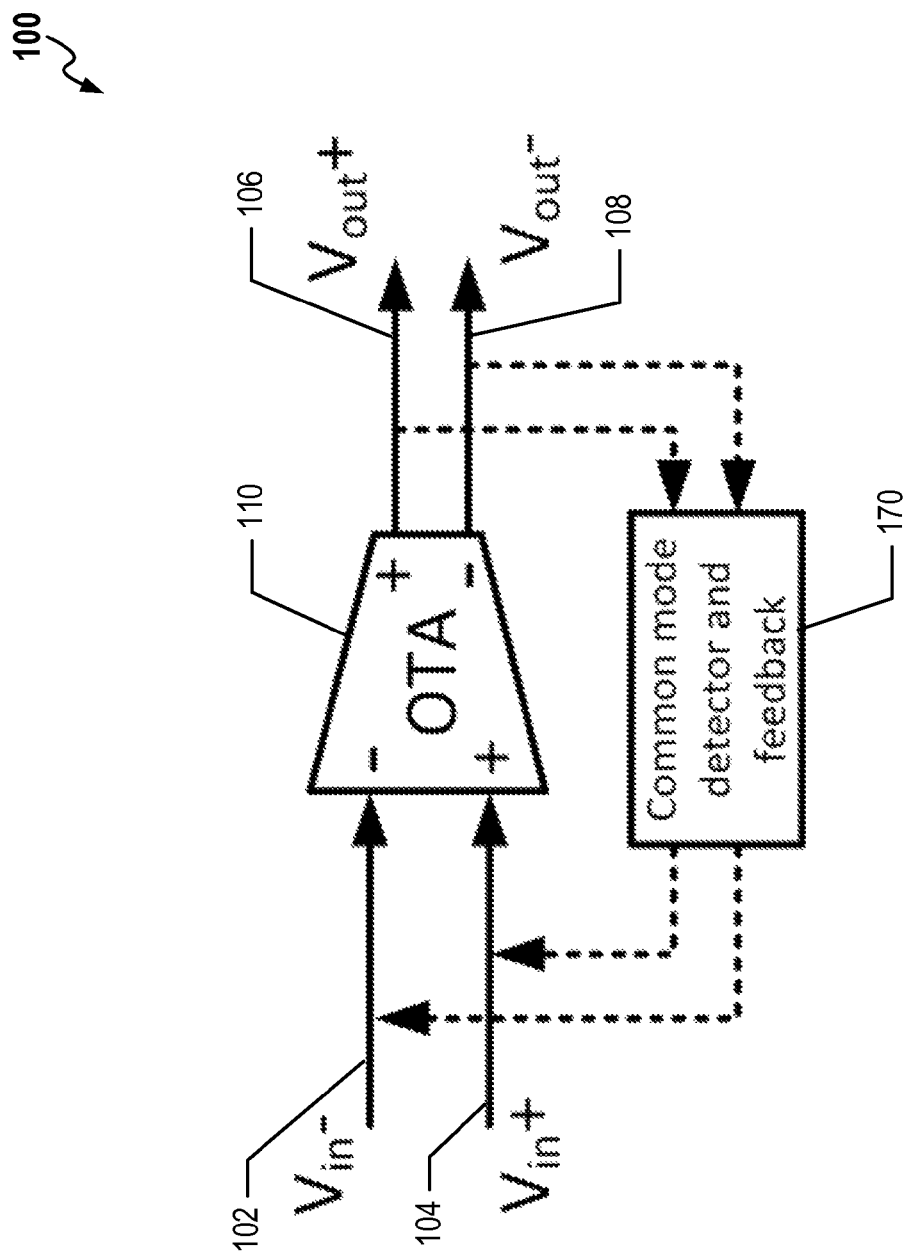
FIG. 1 is a block diagram of a sense amplifier having an Operational Transconductance Amplifier (OTA) with a Common Mode FeedBack (CMFB) circuit that may be used to describe various aspects of a sense amplifier configured in accordance with various aspects of the method and apparatus for low-level input sense amplification approach disclosed herein.

The following presents a simplified summary of one or more aspects of the disclosed approach, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects for implementing a low-input level sense amplifier are disclosed herein. In accordance with one aspect of the disclosed approach, the sense amplifier includes an amplifier circuit configured to receive, at an input, an input signal having an input level generated based on a programmable device, the amplifier circuit configured to provide an amplified output signal including a gain with respect to the input level. The sense amplifier further includes a feedback circuit coupled to receive the amplified output signal from the amplifier circuit, the feedback circuit configured to provide, at the input of the amplifier circuit, an adjusted version of the amplified output signal comprising a modified output magnitude based on common mode feedback.

In accordance with another aspect of the disclosed approach, a method for sense amplification in a sense amplifier is provided. The method includes receiving, at an input of an amplifier circuit, an input signal having an input level generated based on a programmable device; providing an amplified output signal including a gain with respect to the input level; receiving the amplified output signal from the amplifier circuit at a feedback circuit; and providing, to the input of the amplifier circuit, an adjusted version of the amplified output signal having a modified output magnitude based on common mode feedback.

In accordance with yet another aspect of the disclosed approach, a sense amplifier is provided that includes means for receiving, at an input of an amplifier circuit, an input signal having an input level; means for providing an amplified output signal having a gain with respect to the input level generated based on a programmable device; means for receiving the amplified output signal from the amplifier circuit at a feedback circuit; and means for providing, to the input of the amplifier circuit, an adjusted version of the amplified output signal having a modified output magnitude based on common mode feedback.

These and other aspects of the disclosed approach will become more fully understood upon a review of the detailed description, which follows.

DETAILED DESCRIPTION

In the following description, reference is made to the accompanying drawings in which is shown, by way of illustration, one or more specific approaches in which various aspects of the disclosure may be practiced. Any detailed description of a specific approach is not to be taken in a limiting sense, and the scope of the disclosure is defined only by the appended claims. The description contained herein is intended to describe various aspects of the disclosure in sufficient detail to enable those of ordinary skill in the art to practice the claimed scope of the disclosure. Other approaches may be utilized and changes may be made to the disclosed approach without departing from the spirit of the disclosure.

Further, in the following description elements may be described and illustrated in block diagram form in order not to obscure the disclosed approach due to the inclusion of unnecessary detail. Although any delineation or partitioning of logic between various blocks in a block diagram is to be understood to be of a specific implementation, unless specified otherwise herein, any specific implementation shown and described should only be construed as an example and should not be construed as the only way to implement the disclosed approach. Thus, it should be readily apparent to one of ordinary skill in the art that the disclosed approach may be practiced using numerous other delineations or partitioning of logic between various blocks.

One or more of the elements described herein and illustrated in the drawings may be rearranged; combined into a single element; and/or embodied in several elements. These elements may also be referred to herein as modules, circuits, units, components, acts, features, steps, and/or functions. Additional elements may also be included to describe and illustrate, but without departing from the spirit of, the various aspects of the disclosed approach. For example, any element described herein may include multiple instances of that element. These elements may be generically indicated by a numerical designator (e.g., "110"), and specifically indicated by the numerical indicator followed by either an alphabetic designator (e.g., "110a" or "110A") or a numeric indicator proceeded by a "dash" (e.g., "110-1"). For ease of following the description, element number indicators will for the most part begin with the number of the figure in which the elements are introduced or most fully discussed.

The following description includes examples in order to provide those of ordinary skill in the art with a better understanding of various aspects of the disclosed approach, and is not meant to be limiting of the scope, applicability, or configuration set forth in the claims. Thus, changes may be made in the function and arrangement of the elements discussed without departing from the spirit and limiting scope of the disclosure. Changes to various aspects of the disclosed approach may also omit, substitute, or add various procedures or components as appropriate, while still remaining within the scope of the disclosed approach. For instance, various steps may be added, omitted, combined, and/or even changed in their order during a particular performance of any of the methods described herein. Also, features described with respect to certain aspects may be combined in other aspects.

Continuous demands for reduction in size of circuit designs implemented using CMOS technology typically require a concomitant reduction in supply voltage levels. With lower supply voltage levels, sense margins decreases dramatically. In accordance with various aspects of the disclosed approach, to address these issues, sense amplifier designs capable of detection of small input signals and amplified to large output signals are provided. Also, a feedback configuration for the sense amplifier may be used to bias it in a maximum-gain condition. Further, read disturb effects may be minimized by the sense amplifier even while operating under conditions of decreased sense margins and varied ranges of supply voltage levels.

FIG. 1 illustrates a sense amplifier 100 configured in accordance with one aspect of the disclosed approach for low-voltage sense amplification of e-fuse read operations, where the sense amplifier 100 includes an amplifier circuit 110 and a feedback circuit 170. The amplifier circuit 110 may detect a response of the e-fuse, which may be referred to herein as an e-fuse device, a programmable memory device, a programmable e-fuse device, or a programmable device. In one aspect of the disclosed approach, the amplifier circuit 110 may be implemented using an Operational Transconductance Amplifier (OTA) and may be configured to amplify a small differential input signal having an input level at an input of Vin:

$$\Delta Vin = (Vin+ - Vin-), \quad \quad \quad (Eq.\ 1)$$

where Vin−102, Vin+104 are negative and positive inputs, respectively, at the input of the amplifier circuit 110, and Δ Vin is the differential input signal of Vin.

As further described herein, values of Vin−102 and Vin+104 are respectively derived based on a resistance of the e-fuse referred to herein as R_fuse, and a reference resistance referred herein as R_ref. For example, sense amplifiers typically employ current loading on R_fuse and R_ref to generate voltages (i.e., determined values) on each of these devices, and thereby determine a voltage difference between the generated voltages (i.e., a difference of the determined values). This voltage difference, a range of which may be referred to as a sense margin, is a parameter that the sense amplifier should operate with as an input to be able to amplify. The sense margin may proportionally decrease with reduced supply voltage levels that are desirable in modern designs. Ensuring current levels that may allow proper operation even with variations in device characteristic poses a challenge.

An output of the amplifier circuit 110 may be expressed as:

$$Vout = (Vout+ - Vout-) = \alpha^* \Delta Vin, \quad \quad \quad (Eq.\ 2)$$

where the output includes an amplified output signal with Vout that is made up of a difference between Vout+106 and Vout–108, which are positive and negative outputs, respectively, of the amplifier circuit 110; and α is a small signal voltage gain that is a factor of the input level of the amplifier circuit 110. By way of example, a value of α may typically be around 10x~100x.

In one aspect of the disclosed approach, the feedback circuit 170 may be implemented as a Common Mode FeedBack (CMFB) circuit, where the CMFB circuit functions as an automatic bias circuit to preferably maintain the output Vout of the amplifier circuit 110 at a level of maximum small signal gain. Thus, if the output Vout of the amplifier circuit 110 begins to drop below a minimal level, the feedback circuit 120 may increase the output Vout.

Conversely, if the output Vout of the amplifier circuit 110 begins to rise above a maximal level, the feedback circuit 120 may decrease the output Vout. In other words, the feedback circuit 120 may, at the input of the amplifier circuit, provide an adjusted version of the amplified output signal (i.e., the output Vout of the amplifier circuit 110), that includes a modified output magnitude based on common mode feedback.

Figure 2:
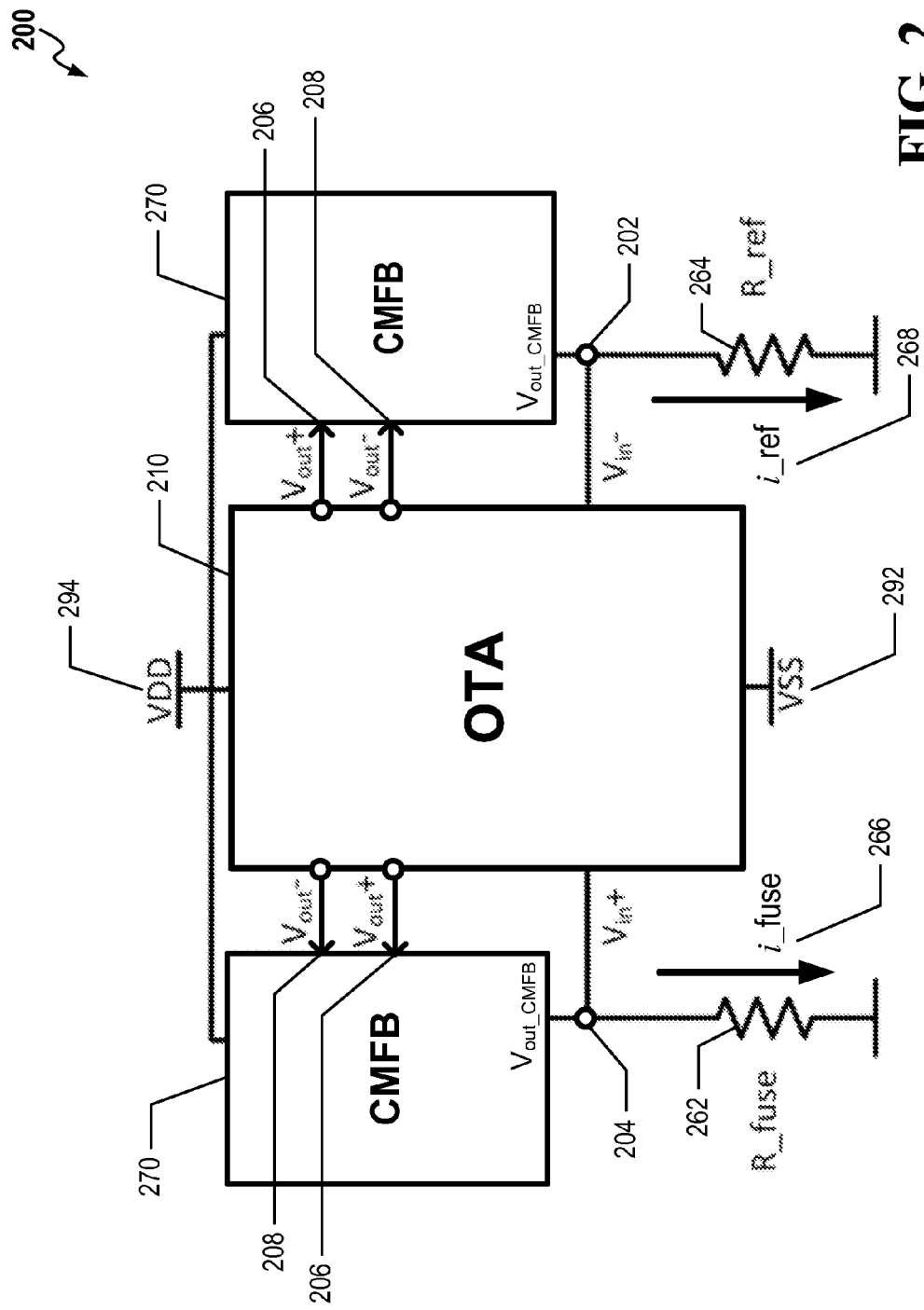
FIG. 2 is a simplified block diagram of a sense amplifier with an OTA and a CMFB circuit that may assist in understanding operation of sense amplifiers configured in accordance with various aspects of the sense amplifier approach of FIG. 1.

FIG. 2 illustrates a general block diagram of a sense amplifier architecture 200 configured in accordance with one aspect of the disclosed approach for low-voltage sense amplification of e-fuse read operations, where the sense amplifier 200 includes an amplifier circuit 210 and a feedback circuit 270. The amplifier circuit 210 may detect a response of an e-fuse with a resistance of R_fuse 262 with respect to a reference resistance of R_ref 264. As noted, the e-fuse may be referred to herein as an e-fuse device, a programmable memory device, a programmable e-fuse device, or a programmable device.

In one aspect of the disclosed approach, the amplifier circuit 210 may be implemented using an OTA circuit, and the feedback circuit 270 may be implemented using a CMFB circuit. The amplifier circuit 210 includes a $V_{in}$+ input 204 and an $V_{in}$– input 202, that are coupled to R_fuse 262 and R_ref 264, respectively. The amplifier circuit 210 provides a $V_{out}$+ output 206 and a $V_{out}$– output 208, both of which are fed to the feedback circuit 270. Outputs from the feedback circuit 270, labeled as $V_{out\_CMFB}$, are also directly coupled to the $V_{in}$+ input 204 and an $V_{in}$– input 202. These outputs from the feedback circuit 270 produce a current i_fuse 266 through R_fuse 262 (from $V_{in}$+ 204) and a current i_ref 268 through R_ref 264 (from $V_{in}$– 202). Notably, as $V_{out\_CMFB}$ outputs from the feedback circuit 270 are directly coupled to the inputs of the amplifier circuit 210, they directly affect the input to the amplifier circuit 210 as well as the currents through R_fuse 262 and R_ref 264 (respectively i_fuse 266 and i_ref 268). Thus, the feedback circuit 270 may more closely regulate the amplifier circuit 210 such that the current i_fuse 266 may be maintained within a desirable range.

Figure 3:
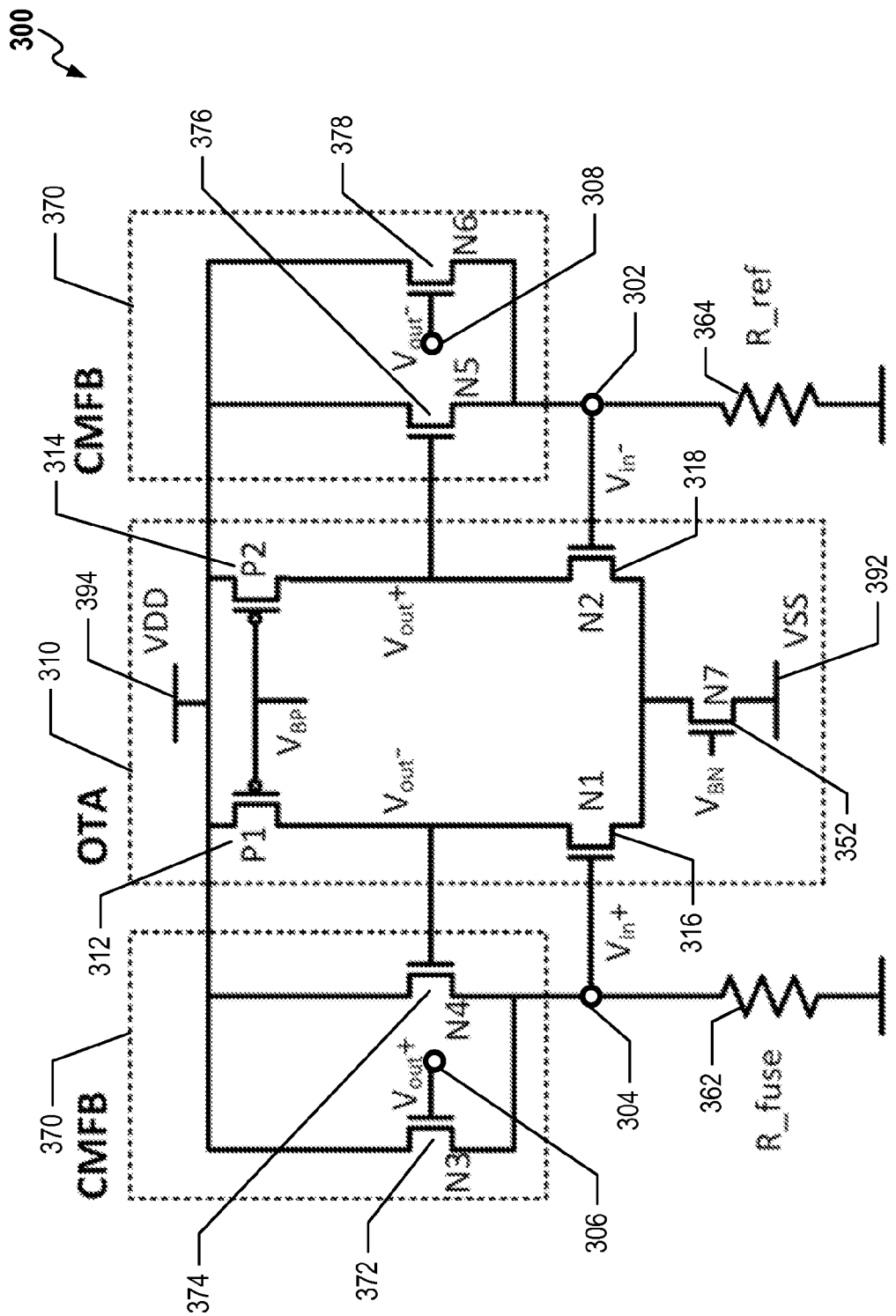
FIG. 3 is a circuit diagram of a sense amplifier with an NMOS input OTA and an NMOS follower CMFB circuit configured in accordance with various aspects of the sense amplifier approach of FIG. 1.

FIG. 3 illustrates a sense amplifier 300 that may be configured in accordance with an aspect of the method and apparatus for low-level input sense amplification approach illustrated in FIG. The sense amplifier 300 may include both an amplifier circuit 310 and a feedback circuit 370. The amplifier circuit 310 may be configured to receive and amplify a differential input signal based on a difference between an e-fuse resistance (R_fuse) 362 of an e-fuse device and a reference resistance (R_ref) 364, as further described herein. As noted above, the e-fuse device may also be referred to as a programmable device. Sense amplifiers usually employ current loading on the e-fuse resistance and the reference resistor to generate voltage difference.

In one aspect of the disclosed approach, the amplifier circuit 310 may be implemented as an NMOS-input OTA circuit that is configured as a differential-input/output voltage amplifier with NMOS-inputs where an input NMOS pair N1 316, N2 318 receive the differential input signal. Further, a PMOS pair P1 312, P2 314, along with an NMOS N7 352, serves as differential loading for the amplifier circuit 310. As discussed above, when the amplifier circuit 310 operates in an amplifying region, the NMOS-input OTA circuit has a small signal output $V_{out}$ of:

$$V_{out} = \alpha * V_{in}, \quad \text{(Eq. 3)}$$

where α is a gain factor of an input voltage level $V_{in}$ of the amplifier circuit 310 with respect to a ground, or base voltage level $V_{SS}$ 392. $V_{in}$ may be based on a difference between a positive input $V_{in+}$ 304 at R_fuse 362 and a negative input $V_{in-}$ 302 at R_ref 364. A value for each of $V_{in+}$ 304 and $V_{in-}$ 302 may be determined due to respective currents through R_fuse 362 and R_ref 364. In other words, a difference between these determined values may then be used by the amplifier circuit 310 as a differential input.

In one aspect of the disclosed approach, the feedback circuit 370 of the sense amplifier 300 may be implemented as an NMOS-follower CMFB circuit. As illustrated, the feedback circuit 370 includes an NMOS follower for each side, controlled by $V_{out+}$ and $V_{out-}$, respectively. Specifically, a first NMOS pair N3 372, N5 376 and a second NMOS pair N4 374, N6 378—where each NMOS includes a respective gate such that the gates of the first NMOS pair N3 372, N5 376 are coupled to receive $V_{out+}$ 306 and the gates of the second NMOS pair N4 374, N6 378 are coupled to receive $V_{out-}$ 308.

In such a configuration, regardless of whether the output of the amplifier circuit 310 has a positive or negative differential, the difference between the voltage levels of $V_{in+}$ 304 and $V_{in-}$ 302 may be sustained at a level to turn on the input NMOS pair N1 316, N2 318, and thus the amplifier circuit 310 may operate in the amplifying region. This minimizes a current through R_fuse 362, which reduces unwanted read disturb issues.

A minimum operational $V_{DD\_min}$ of $V_{DD}$ supply 394 of the sense amplifier 300 in FIG. 3 is:

$$V_{DD\_min} = V_{OD\_P1} + (V_{TH\_N4} + V_{OD\_N4}) + (V_{TH\_N1} + V_{OD\_N1}) + V_{OD\_N7}, \quad \text{(Eq. 4)}$$

which reduces to:

$$V_{DD\_min} = 2*V_{TH\_N} + 4*V_{OD}, \quad \text{(Eq. 5)}$$

where $V_{TH}$ is a threshold voltage and $V_{OD}$ is an overdrive voltage for each device such that:

$$V_{OD} = V_{GS} - V_{TH} \quad \text{(Eq. 6)}$$

where $V_{GS}$ is a gate-to-source voltage for each device. As such, $V_{OD}$ of each device may be defined as a voltage level between a gate and a source of the device that is in excess of the threshold voltage, where the threshold voltage is defined as a minimum voltage level required between the gate and the source to turn the device on and conduct electricity. In other words, $V_{OD}$ may also be referred to as "excess gate voltage" or "effective voltage", which is important as $V_{OD}$ directly affects an output drain terminal current ($I_D$) of the transistor, an important property of amplifier circuits. By controlling $V_{OD}$, $I_D$ may be controlled to determine whether saturation is reached.

In one aspect of the disclosed approach, $V_{OD}$ is a minimum drain-to-source voltage ($V_{DS}$) level for a MOSFET device working in saturation region, which will allow each device to have a high output resistance to achieve high OTA gain. Specifically, $V_{OD}$ has been defined based on a gate-to-source voltage (see Eq. 6, where $V_{OD} = V_{GS} - V_{TH}$). Further, in order for the device work in the saturation region, $V_{DS}$ of the device needs to be higher than $V_{OD}$ to cut off the device channel. For example, with a given $V_{GS}$ bias of 1.0 v, assuming that $V_{TH}$ is 0.4 v, then $V_{OD}$ of this device would be 0.6 v. Thus, $V_{DS}$ bias needs to be higher than 0.6 v for the device to work in saturation. Typical, $V_{OD}$ may be designed to be approximately 0.1V, where $V_{TH}$ varies with different technologies. By using zero-$V_{TH}$ devices for both the input NMOS pair N1 316, N2 318 and the feedback followers N3 372, N4 374, N5 376, N6 378; $V_{DD\_min}$ may be reduced to approximately 0.5V. These devices, also known as native devices, are typically available for most CMOS technologies.

Figure 4:
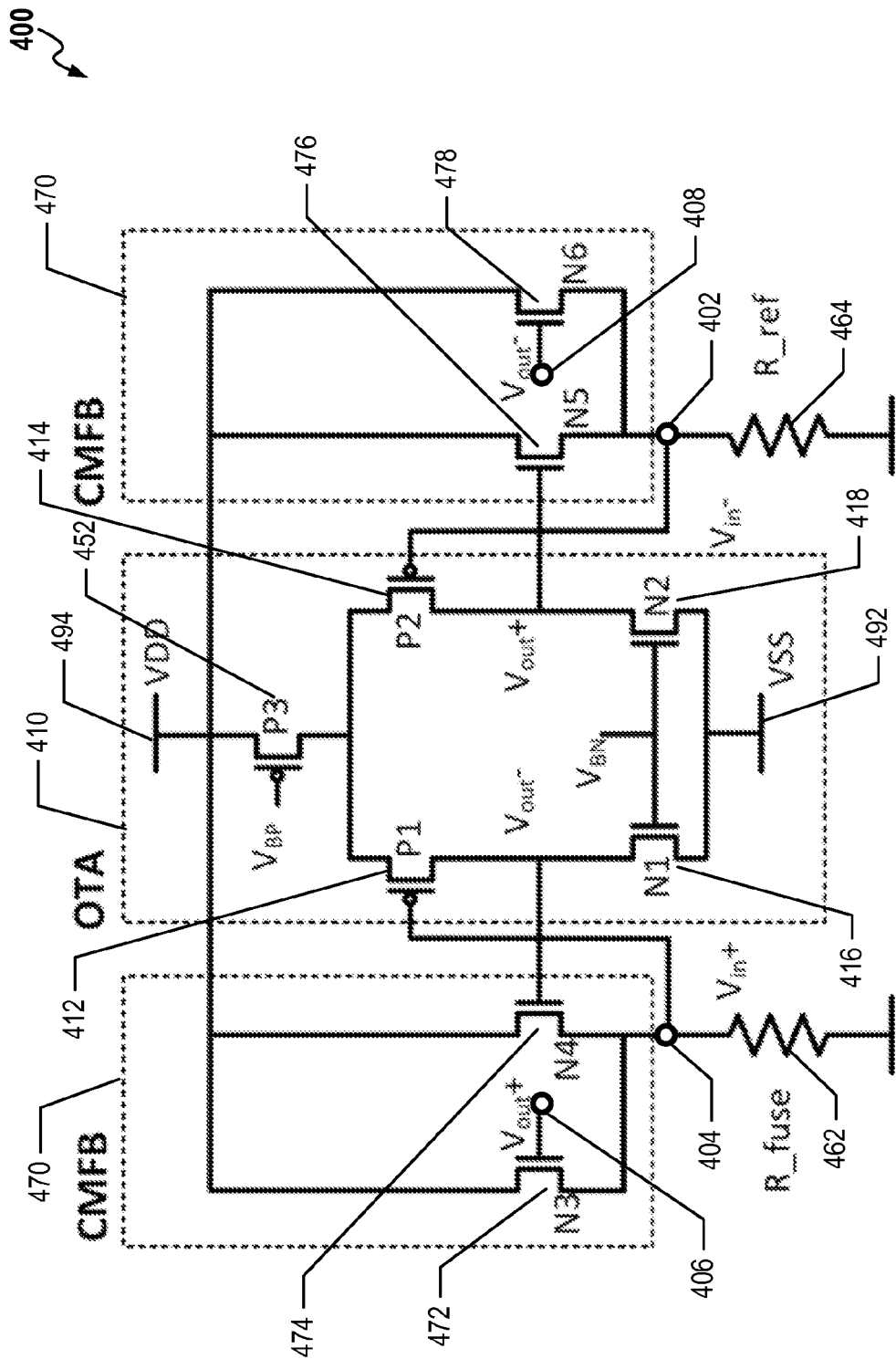
FIG. 4 is a circuit diagram of a sense amplifier with a PMOS input OTA and an NMOS-follower CMFB circuit configured in accordance with various aspects of the sense amplifier approach of FIG. 1.

FIG. 4 illustrates another aspect of the disclosed approach, a PMOS pair P1 412, P2 414 may be used for input in a sense amplifier 400 configured in a fashion similar to the sense amplifier 300. The sense amplifier 400 may include both an amplifier circuit 410, implemented as a PMOS-input OTA circuit; and a feedback circuit 470 that may be implemented as an NMOS-follower CMFB circuit. Further, as compared to the amplifier circuit 310, an NMOS pair N1 416, N2 418, along with a PMOS P3 452, serves as differential loading for the amplifier circuit 410. Similar to the sense amplifier 300 discussed above, when the amplifier circuit 410 operates in an amplifying region, the PMOS-input OTA circuit has a small signal output $V_{out}$ of:

$$V_{out}=\alpha*V_{in}, \quad\text{(Eq. 7)}$$

where $\alpha$ is a gain factor of an input voltage level $V_{in}$ of the amplifier circuit 410 with respect to a $V_{SS}$ 492.

As illustrated, the sense amplifier 400 includes the feedback circuit 470, which includes two NMOS followers for each side, controlled by $V_{out+}$ and $V_{out-}$, respectively. Specifically, a first NMOS pair N3 472, N5 476 and a second NMOS pair N4 474, N6 478—where each NMOS includes a respective gate such that the gates of the first NMOS pair N3 472, N5 476 are coupled to receive $V_{out+}$ 406 and the gates of the second NMOS pair N4 474, N6 478 are coupled to receive $V_{out-}$ 408. In the sense amplifier 400, a minimum operational $V_{DD}$ supply of the circuit $V_{DD\_min}$ may be defined as:

$$V_{DD\_min}=V_{OD\_P3}+(V_{TH\_P1}+V_{OD\_N4})+V_{fuse}, \quad\text{(Eq. 8)}$$

where, for typical values $V_{OD}$=0.1V, $V_{TH\_P1}$=0.3V, and $V_{fuse}$=0.1V, $V_{DD\_min}$ may be 0.6V.

In such a configuration, regardless of whether the output of the amplifier circuit 410 has a positive or negative differential, the input voltage between $V_{in+}$ 404 and $V_{in-}$ 402, as compared to a e-fuse resistance (R_fuse) 462 of an e-fuse device and a reference resistance (R_ref) 464, may be sustained at a level to turn on the input PMOS pair P1 412, P2 414, and thus the amplifier circuit 410 may operate in the amplifying region. As noted above, the e-fuse device may also be referred to as a programmable device.

As a sense amplifier may encounter different ranges of input levels, it may be desirable to have a sense amplifier design that may be flexible operating with a variety of sense margins.

Figure 5:
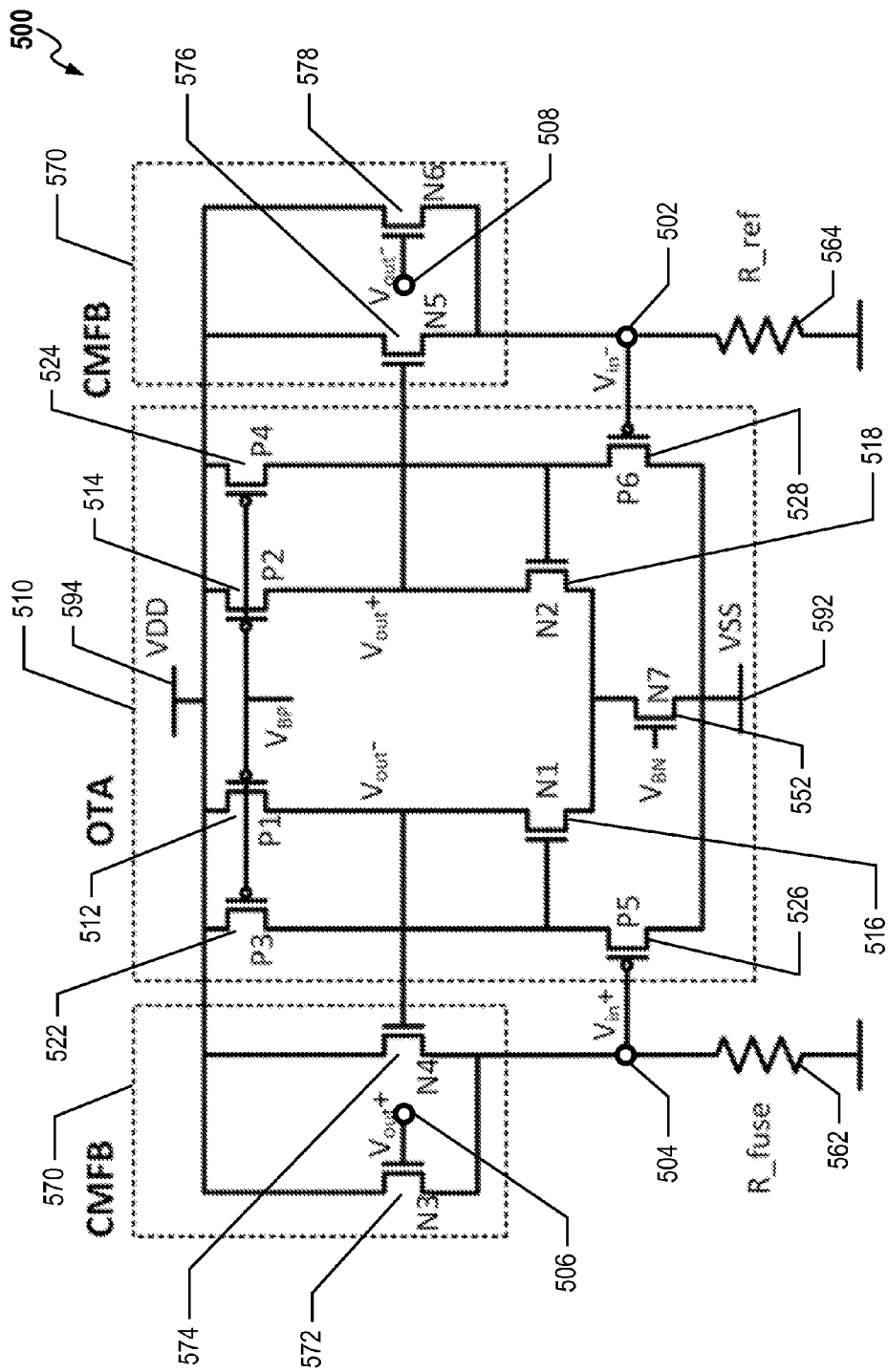
FIG. 5 is a circuit diagram of a sense amplifier with a PMOS input OTA and an NMOS-follower CMFB circuit along with a PMOS level shifter configured in accordance with various aspect of the sense amplifier approach of FIG. 1.

FIG. 5 illustrates a sense amplifier 500 configured in another aspect of the disclosed approach, implemented as a low-voltage e-fuse sense amplifier that may include a PMOS-follower structure to shift the input voltage level. The sense amplifier 500 includes an amplifier circuit 510 implemented as an OTA circuit, where the amplifier circuit 510 includes a differential-input/output structure N1 516, N2 518, P1 512, P2 514, N7 552, with a PMOS-follower structure implemented using an input PMOS pair P5 526, P6 528, and a bias PMOS pair P3 522, P4 524 to shift the input level. The sense amplifier 500 also includes a feedback circuit 570, which in one aspect of the disclosed approach is implemented with a CMFB circuit that includes a source follower structure with NMOS N3 532, N4 534, N5 544, and N6 542.

As discussed above, when the amplifier circuit 510 operates in an amplifying region, the OTA circuit has a small signal output $V_{out}$ of:

$$V_{out}=\alpha*V_{in}, \quad\text{(Eq. 9)}$$

where $\alpha$ is a gain factor of an input voltage level $V_{in}$ of the amplifier circuit 510 with respect to a ground, or base voltage level $V_{SS}$ 592. $V_{in}$ may be based on a difference between a positive input $V_{in+}$ 504 at R_fuse 562 and a negative input $V_{in-}$ 502 at R_ref 564. A value for each of $V_{in+}$ 504 and $V_{in-}$ 502 may be determined due to respective currents through an e-fuse resistance (R_fuse) 562 of an e-fuse device and a reference resistance (R_ref 564). In other words, a difference between these determined values may then be used by the amplifier circuit 510 as a differential input. As noted above, the e-fuse device may also be referred to as a programmable device.

The minimum operational $V_{DD}$ supply level with which the sense amplifier 500 in FIG. 5 may operate is:

$$V_{DD\_min}=V_{OD\_P1}+(V_{TH\_N4}+V_{OD\_N4})-(V_{TH\_P5}+V_{OD\_P5})+(V_{TH\_N1}+V_{OD\_N1})+V_{OD\_N7}, \quad\text{(Eq. 10)}$$

where, for CMOS technologies, the threshold voltage $V_{TH}$ of NMOS and PMOS have approximately equal absolute values and thus may cancel each other to change $V_{DD\_min}$ to:

$$V_{DD\_min}=V_{TH\_N}+3*V_{OD}, \quad\text{(Eq. 11)}$$

where it may be seen that $V_{DD\_min}$ is more dominated by $V_{OD}$, and less sensitive to $V_{TH}$. With typical values of $V_{TH\_N}$=0.2V and $V_{OD}$=0.1V, $V_{DD\_min}$ could be as low as 0.5V. Thus, the low-voltage e-fuse sense amplifier scheme as shown in FIG. 5 provides a $V_{DD\_min}$ that is less sensitive to $V_{TH}$, while still maintaining improved read disturb immunity.

In one aspect of the disclosed approach, an input level shifting mechanism as provided herein should allow the sense amplifier 500 to work properly at extremely low $V_{DD}$, such as 0.5V, without use of native NMOS devices. Notice that no native devices or zero-$V_{TH}$ devices are needed in this design to achieve a low level of $V_{DD\_min}$. In addition, the pair of PMOS P3 522, P4 524 that performs the level shifting may allow for a very low input level to be used, providing for a fuse bit line voltage to remain at a low level input, which improves read disturb immunity. In other words, the sense amplifier 500 may operate with a lower input voltage, which means that current flowing through R_fuse 562 may be lower than in other designs. A lower current means a lower voltage level at $V_{in+}$ 504, but the sense amplifier 500 may operate as intended with this lower voltage. Lowering the current through R_fuse 562 may be desirable because resistance of an unblown fuse increases over time, based on an amount of current conducted by the unblown fuse. In accordance with various aspects of the disclosed approach, the current through the unblown fuse is reduced, thereby slowing an effect by which the resistance of the unblown fuse increases over time.

Another advantage of the PMOS-follower design of FIG. 5 is that it allows a very low input voltage level ($V_{in+}$ and $V_{in-}$), which thus improves immunity to read disturb effect. The typical specification for fuse current during read operation to avoid read disturb effect is less than 1 mA, which means fuse bit-line voltage levels should be around 0.1V. By using the PMOS-follower design as illustrated in FIG. 5, input level of the fuse bit line is shifted down by ($V_{TH\_P}+V_{OD\_P}$), and could be close to $V_{SS}$, which improves the read disturb immunity.

Although being able to operate with low input voltage levels is desirable, in certain applications a sense amplifier design that may minimize read disturb issues should be able to accommodate a large $V_{DD}$ range. Normally, however, input levels increase as $V_{DD}$ increases, even with improvement of shifter design. With a sense amplifier design incorporating a feedback circuit such as a CMFB circuit, the input level may be defined as:

$$V_{in+} = V_{out+} - (V_{TH\_N4} + V_{OD}),\qquad\text{(Eq. 12)}$$

where $V_{out+}$ is a high-end output level, i.e. $V_{DD} - V_{OD\_P}$. Therefore, the read disturb problem may be worse at high $V_{DD}$.

Figure 6:
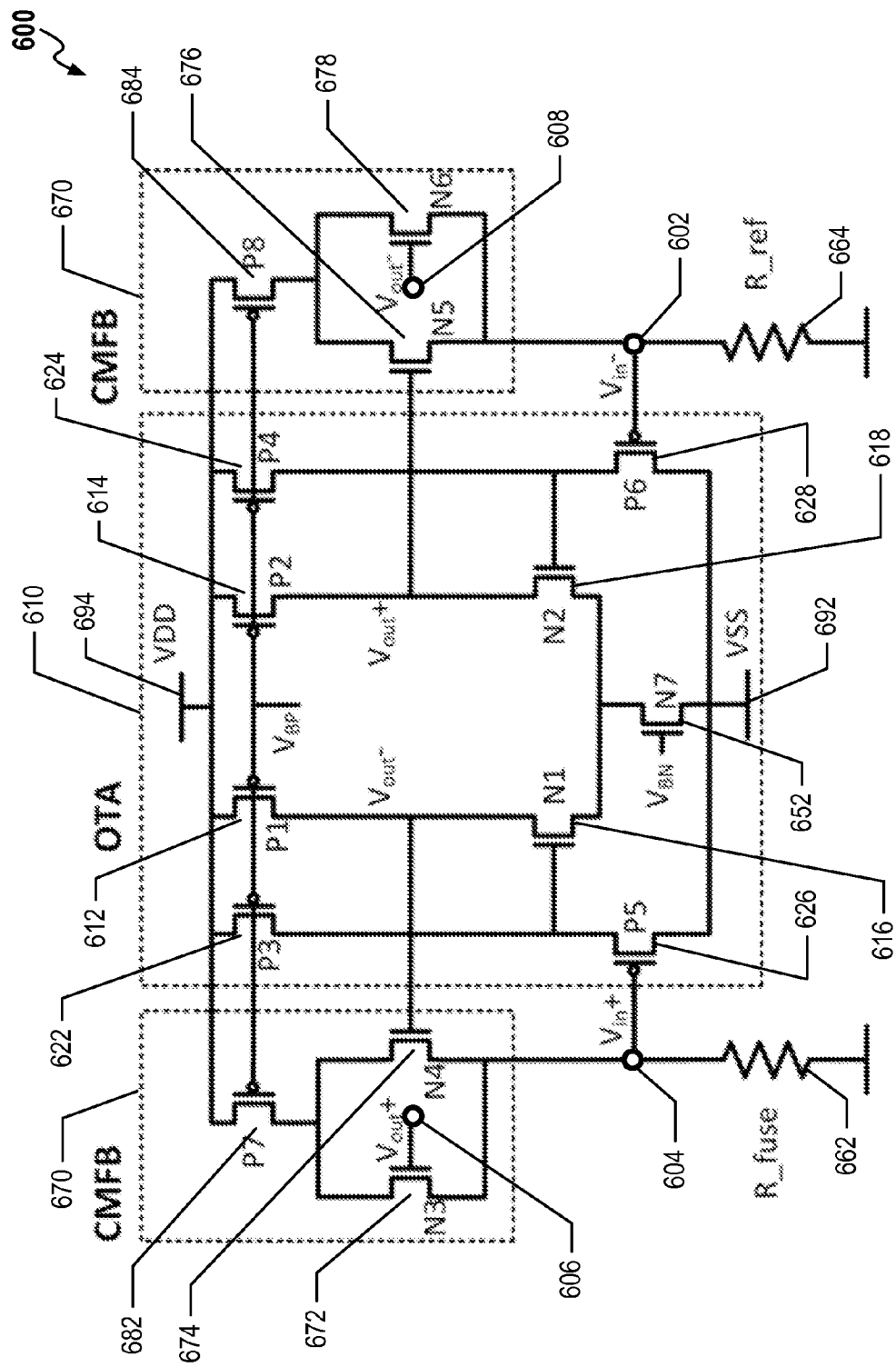
FIG. 6 is a circuit diagram of a sense amplifier with a PMOS input OTA and a current limited, NMOS-follower CMFB circuit along with a PMOS level shifter configured in accordance with various aspects of the sense amplifier approach of FIG. 1.

FIG. 6 illustrates a sense amplifier approach that may address read disturb issues in the presence of higher levels of supply voltages, where a sense amplifier 600 includes a current-limited feedback circuit that may improve read disturb immunity at high levels of $V_{DD}$. The sense amplifier 600 also includes an amplifier circuit 610 implemented as an OTA circuit in one aspect of the disclosed approach, where the amplifier circuit 610 includes a differential-input/output structure N1 616, N2 618, P1 612, P2 614, N7 652. The amplifier circuit 610 also includes a PMOS-follower structure to shift the input voltage level similar to the sense amplifier 500 illustrated in FIG. 5. The PMOS-follower structure may be implemented using a pair of PMOS P5 626, P6 628, and a pair of bias PMOS P3 622, P4 624 to shift the input level.

As discussed above, when the amplifier circuit 610 operates in an amplifying region, the OTA circuit has a small signal output $V_{out}$ of:

$$V_{out} = \alpha * V_{in},\qquad\text{(Eq. 13)}$$

where $\alpha$ is a gain factor of an input voltage level $V_{in}$ of the amplifier circuit 510 with respect to a ground, or base voltage level $V_{SS}$ 692. $V_{in}$ may be based on a difference between a positive input $V_{in+}$ 604 at R_fuse 662 and a negative input $V_{in-}$ 602 at R_ref 664. A value for each of $V_{in+}$ 604 and $V_{in-}$ 602 may be determined due to respective currents through an e-fuse resistance (R_fuse) 662 of an e-fuse device and a reference resistance (R_ref 664). In other words, a difference between these determined values may then be used by the amplifier circuit 610 as a differential input. As noted above, the e-fuse device may also be referred to as a programmable device.

In one aspect of the disclosed approach, the current-limited feedback circuit may be implemented in a feedback circuit 670 that includes a CMFB circuit having an integrated current limiter circuit, where drain terminals of CMFB devices NMOS N3 672, N4 674, N5 676, and N6 678 are no longer directly connected to $V_{DD}$. Instead, the drain terminals of the CMFB devices NMOS N3 672, N4 674, N5 676, and N6 678 are connected to drain terminals of mirrored PMOS current sources P7 682 and P8 684. The PMOS current sources P7 682 and P8 684 are designed to operate at a lower level than a current specification that is designated for each fuse.

By way of example, this lower level may by approximately around 400 uA when the current specification is 1 mA. At a low $V_{DD}$ supply level, when a fuse current is less than a current source level of, for example, 400 uA, the drain terminals of the PMOS current sources P7 682 and P8 684 will be pulled up to make these current sources work in linear region ($V_{DS} < V_{GS} - V_{TH}$). In this case, the PMOS current sources P7 682 and P8 684 do not impact functionality of the sense amplifier 600. In contrast, with a high $V_{DD}$ supply level, when the fuse current is close to the PMOS current sources P7 682 and P8 684 work in saturation region ($V_{DS} > V_{GS} - V_{TH}$), and limit the fuse current at a predetermined designed level. With a current limiter design as embodied by the PMOS current sources P7 682 and P8 684, the fuse current is almost independent to $V_{DD}$ supply and read disturb immunity is greatly improved.

In accordance with various aspects of the disclose approach for implementing the method and apparatus for low-level input sense amplification, reference resistors such as R_ref 364, R_ref 464, R_ref 564, and R_ref 664, may be implemented using any type of resistors available in a variety of technologies, examples of which include—but is not limited to—diffusion resistors, well resistors, silicide resistors, titanium nitride (TiN) resistors, and polycrystalline/polysilicon (poly) resistors. Preferably, a resistance value of the reference resistor may be between the resistance values of an unblown fuse and blown fuse in order to generate voltage difference during read operation. For example, if it is assumed that unblown fuse resistance is less than 50 ohm, and blown fuse resistance is higher than 3K ohm, then a value for the reference resistance of 700 ohm may be chosen. It should be noted that due to variations in device manufacturing and other variables that the resistance values provided herein are not necessarily exact and are provided as examples only.

Figure 7:
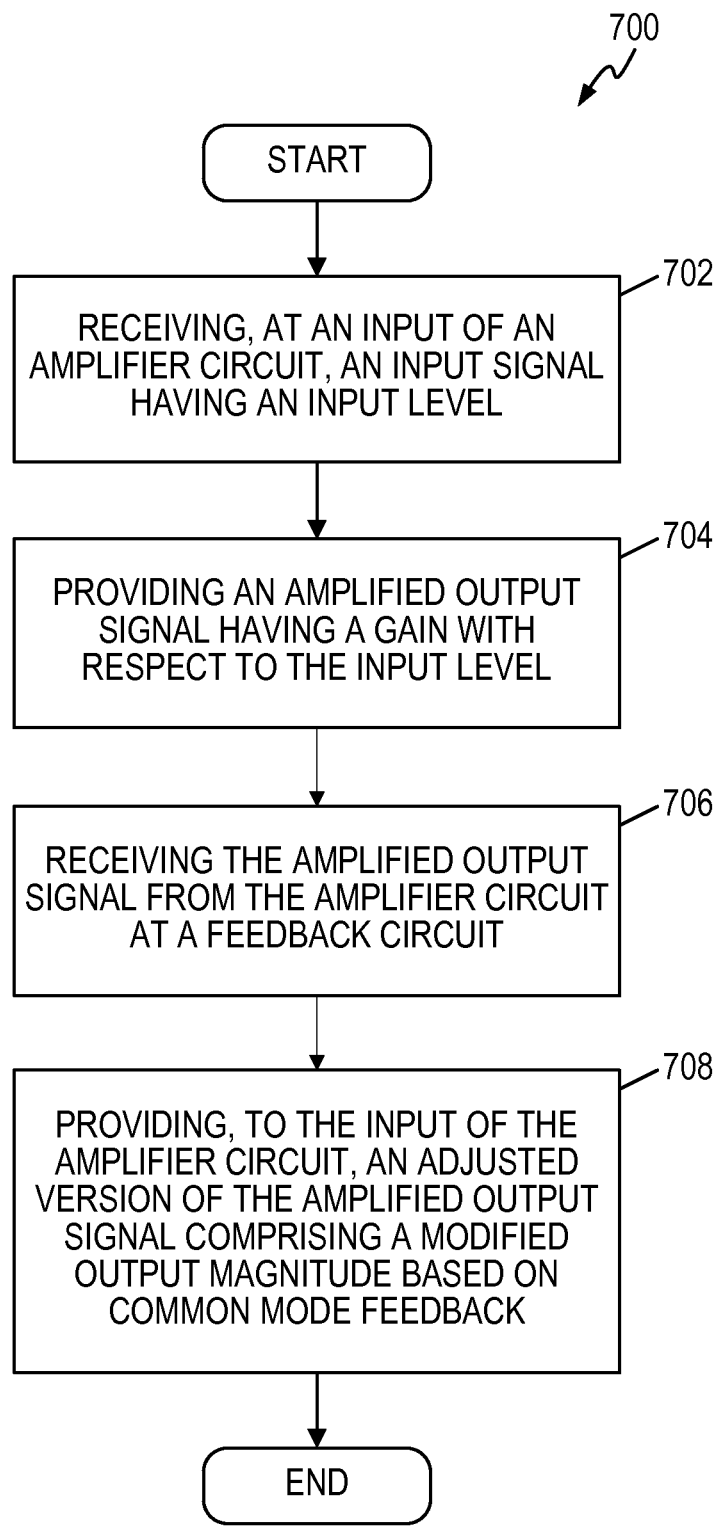
FIG. 7 is a flow diagram of a sense amplifier operation configured in accordance with various aspects of the sense amplifier approach of FIG. 1.

FIG. 7 illustrates a sense amplification process 700 configured in accordance with various aspects of the disclosed approach for the method and apparatus for low-level input sense amplification in a sense amplifier such as the various sense amplifiers described herein where, at 702, an input signal is received at an input of an amplifier circuit of the sense amplifier. In one aspect of the disclosed approach, the input signal includes an input level that includes a differential input based on a difference of determined values between a programmable device and a reference device.

At 704, an amplified output signal is provided from the amplifier circuit. In one aspect of the disclosed approach, the amplified output signal includes a gain with respect to the input level. Further, in accordance with another aspect of the disclosed approach, the amplifier circuit may include a follower circuit that may shift the input voltage level.

At 706, the amplified output signal from the amplifier circuit is received at a feedback circuit.

At 708, an adjusted version of the amplified output signal is provided by the feedback circuit to the input of the amplifier circuit. In one aspect of the disclosed approach, the adjusted version of the amplified output signal includes a modified output magnitude based on common mode feedback.

Figure 8:
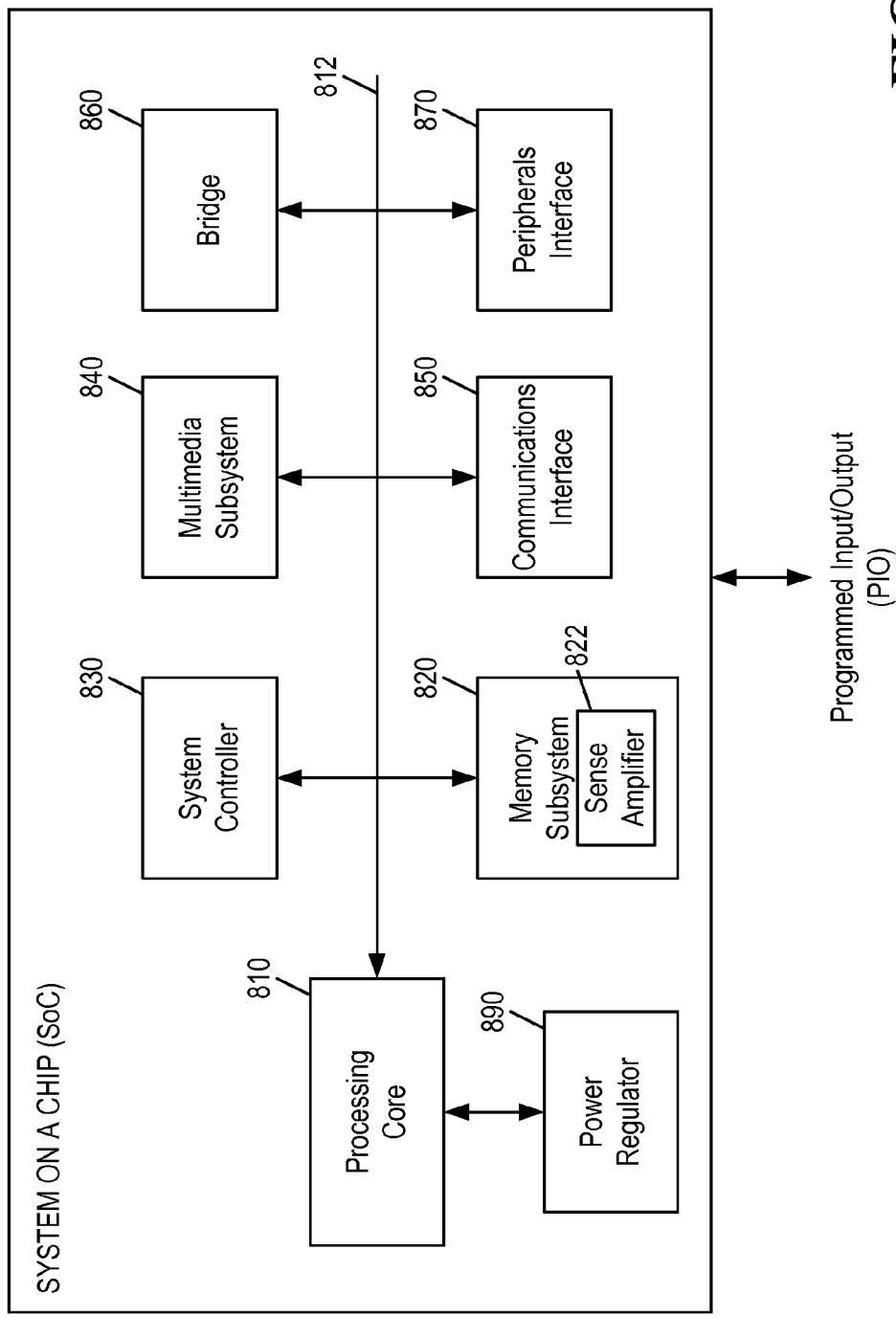
FIG. 8 is a block diagram conceptually illustrating an example of a system on a chip (SoC) in which a sense amplifier configured in accordance with various aspect of a disclosed approach for implementing the method and apparatus for low-level input sense amplification may be used.

FIG. 8 illustrates a typical system on a chip (SoC) 800 in which various aspects of a charge pump configured in accordance with the disclosed approach for implementing a method and apparatus for low-level input sense amplification may be utilized, such as the charge pump implementations described herein. The SoC 800 includes a processing core 810 and a memory subsystem 820, supported by a system controller 830 and various other modules, components, and subsystems (referred to generally as subsystems) such as a multimedia subsystem 840, a communications interface 850, and a peripherals interface 870, as further described herein. A bus 812 and a bridge 860 may be included to interconnect the various subsystems in the SoC 800. Further, the SoC 800 also includes a power regulator 890 coupled to the processing core 810 to provide voltage and current regulation for the various subsystems in the SoC 800, as well as a clock 880 that may be used to distribute.

In one aspect of the disclosed approach, the SoC 800 may be implemented in a single IC. In another aspect of the disclosed approach, the various modules and subsystems may be implemented as a system-in-package (SiP), in which a number of ICs may be enclosed in a single package, or chip carrier. Thus, the functionality described herein for SoC 800 may also be implemented using multiple ICs in the SiP, but similarly integrated into the single package.

The processing core 810 may include one or more microcontrollers, microprocessors, or digital signal processing (DSP) cores. Depending on the specific requirements for the SoC 800, the processing core 810 may also include field programmable gate arrays (FPGAs), programmable logic devices (PLDs), state machines, gated logic, discrete hardware circuits, and other suitable hardware configured to perform the various functionality described throughout this disclosure.

The system controller 830 may include modules that may be used to provide control and timing for the SoC 800. For example, the system controller 830 may include timing sources that may be used to control and provide timing necessary for operation of various modules and subsystems in the SoC 800. For example, the system controller 830 may include various timers such as real-time clocks for driving timing of operation of various logic; watchdog timers for detecting and initiating recovery from any malfunctions using modules such as a power-on reset (PoR) generators; and counter-timers. To implement these clocks and timers, the system controller 830 may include oscillators and other timing control circuits such as PLL or DDL modules.

The SoC 800 may provide display output for a display (not shown) via the multimedia subsystem 840. The multimedia subsystem 840 may include a graphics processing unit (GPU), video device drivers, and other devices used to produce graphics display information. The multimedia subsystem 840 may also provide for input of multimedia if the SoC 800 is to feature video or image capture functionality from devices such as from a camera or image sensor. In addition to imaging functionality, the multimedia subsystem 840 may also provide for audio processing for both audio input and output. In general, as used herein the multimedia subsystem 840 is an abstraction of a module that handles all multimedia functionality requested of the SoC 800. As mobile devices become more versatile, the multimedia subsystem 840 may be used to provide other functionality.

The communications interface 850 provides an interface between the SoC 800 and external communications interfaces, such as one or more transceivers. The one or more transceivers may conform to one or more communications standards, and provide a means for communicating with various other apparatus over a transmission medium. For example, an external communications interface may include a wireless transceiver with radio frequency (RF) circuitry and components to allow the SoC 800 to communicate on a mobile network. Other external communications interfaces may include transceivers for local area networks (LANs), including wireless LANs (WLANs), and metropolitan or wide area networks (WANs). MAC and PHY layer components may be implemented in the SoC 800 or in one or more communication interfaces.

The memory subsystem 820 may include a selection of memory devices. In one aspect of the disclosed approach, the memory subsystem 820, referred to generally as a computer-readable medium, may be used for storing data that is manipulated by the processing core 810 or other subsystems of the SoC 800 when executing software or algorithms that include instructions to control the operation of the processing core 810 or other subsystems of the SoC 800. These instructions, or "code," that make up the software or describe various algorithms in the software may themselves be stored in the memory subsystem 820. Although illustrated as being located in the SoC 800, conceptually the memory subsystem 820 as further described herein may include memory components that reside externally to the SoC 800, and distributed across multiple devices or entities. In general, those skilled in the art would understand that it may be more efficient for certain implementations to locate memory components, such as registers, close to other components that may require the functions provided by these memory components most often.

The computer-readable medium may be implemented using computer-readable storage media such as non-transitory computer-readable media. The non-transitory computer-readable media may include, by way of examples, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a removable disk, and any other suitable medium for storing software and/or instructions that may be accessed and read by a processor in a computer or in the processing core 810.

In order to read ROM devices that include e-fuses, a sense amplifier configured in accordance with various aspects of the disclosed approach may be used to minimize read disturbance effects. Thus, for example, the ROM devices in the memory subsystem 820 contained in the SoC 800 may include one or more sense amplifiers that are optimized to reduce read disturbance effects. Preferably, all of the sense amplifiers 822 in the memory subsystem 820 may be configured in accordance with at least one aspect of a method and apparatus for low-level input sense amplification and minimizing read disturbance.

Various means have been disclosed herein that may be used to implement various aspects of the sense amplifier designs disclosed herein. For example, a sense amplifier design configured in accordance with sense amplifier design approaches disclosed herein may include means for receiving, at an input of an amplifier circuit, an input signal having an input level. This means for receiving the input signal may be implemented by the input NMOS pair N1 316, N2 318 in the amplifier circuit 310 of FIG. 3; the input PMOS pair P1 412, P2 414 in the amplifier circuit 410 of FIG. 4; the input PMOS pair P5 526, P6 528 in the amplifier circuit 510 of FIG. 5; and/or the input PMOS pair P5 626, P6 628 in the amplifier circuit 610 of FIG. 6.

The sense amplifier designs disclosed herein may also include means for providing an amplified output signal that includes a gain with respect to the input level. This means for providing the amplified output signal may be implemented by the amplifier circuit 210 of FIG. 2; the amplifier circuit 310 of FIG. 3; the amplifier circuit 510 of FIG. 5; and/or the amplifier circuit 610 of FIG. 6.

The sense amplifier designs disclosed herein may further include means for receiving the amplified output signal from the amplifier circuit at a feedback circuit. This means for receiving the amplified output signal at the feedback circuit may be implemented by the NMOS N3 272, N6 278 in the feedback circuit 270 of FIG. 2; the NMOS N3 372, N6 378 in the feedback circuit 370 of FIG. 3; the NMOS N3 572, N6 578 in the feedback circuit 570 of FIG. 5; and/or the NMOS N3 672, N6 678 in the feedback circuit 670 of FIG. 6.

The sense amplifier designs disclosed herein may still further include means for providing, to the input of the amplifier circuit, an adjusted version of the amplified output signal that includes a modified output magnitude based on common mode feedback. This means for providing an adjusted version of the amplified output signal may be implemented by the feedback circuit 270 of FIG. 2; the feedback circuit 370 of FIG. 3; the feedback circuit 570 of FIG. 5; and/or the feedback circuit 670 of FIG. 6.

The sense amplifier designs disclosed herein may still further include means for shifting a supply voltage level, which may include means for raising the supply voltage level. This means for shifting the supply voltage level may include the bias PMOS pair P3 522, P4 524 in the amplifier circuit 510 of FIG. 5; and/or the bias PMOS pair P3 622, P4 624 in the amplifier circuit 610 of FIG. 6.

The sense amplifier designs disclosed herein may still further include means for limiting a current through a programmable fuse device such as R_fuse 662. This means for limiting the current through the programmable fuse device may include a current-limited feedback circuit such as the feedback circuit 670 in FIG. 6.

The computer-readable medium may also be implemented using other computer-readable media that may include, by way of examples, a carrier wave, a transmission line, and any other suitable medium for transmitting software and/or instructions that may be accessed and read by a processor in a computer or in the processing core 810. The computer-readable medium may be embodied in a computer program product. By way of example, the computer program product may include a computer-readable medium in packaging materials. Those skilled in the art will recognize how best to implement the described functionality presented throughout this disclosure depending on the particular application and the overall design constraints imposed on the overall system.

The peripherals interface 870 may be used to support communications with peripheral devices coupled to the SoC 800 using external interfaces confirming to such industry standards as Universal Serial Bus (USB), FireWire, Universal Synchronous/Asynchronous Receiver/Transmitter (USART), and Serial Peripheral Interface (SPI) busses. The peripherals interface 870 may also include analog interfaces such as digital-to-analog converters (DAC) and analog-to-digital converters (ADC). These peripheral devices may be used to extend the functionality of the SoC 800.

To provide power to the SoC 800, the power regulator 890 may include voltage regulators and power management circuits that interface with power supply components such as one or more power amplifiers, batteries, and converters. In one aspect of the disclosed approach, the power regulator 890 provides power to the SoC 800 based on control information received from the processing core 810. The power regulator 890 may also receive control signals from the system controller 830. Power from the power regulator 890 may be delivered via a power delivery circuit that may include filtering functions. Further, although modern SoCs such as those used in mobile applications include a high level of integration, may designs still dictate that processing and GPU modules operate on their own independent power planes. Thus, the power regulator 890 may also support multiple power planes as necessary.

The SoC 800 may be implemented as having a bus architecture, represented generally by the bus 812 in FIG. 8, and include any number of interconnecting buses and bridges, such as the bridge 860, depending on the specific application of the SoC 800 and overall design constraints. The bus 812 links together the various subsystems of the SoC 800 that, as discussed, may include one or more processors (represented generally by the processing core 810), the memory subsystem 820, and various other subsystems described herein. The bus 812 may include one or more direct memory access (DMA) controllers to route data directly between the memory subsystem 820 and other subsystems, bypassing the processing core 810 and thereby increasing data throughput of the SoC 800.

Those of ordinary skill in the art would understand that the information transmitted, stored, and/or received may be represented using any of a variety of different technologies and techniques. For example, data, instructions, commands, signals, bits, symbols, and chips referenced throughout this description may be represented by voltages, currents, electromagnetic waves, magnetic fields or particles, optical fields or particles, or any combination thereof. Some drawings may illustrate signals as a single signal for clarity of presentation and description. However, it should be understood by those of ordinary skill in the art that the signal may represent several signals, such as those travelling over a signal bus, wherein the signal bus may have a variety of bit widths and the disclosed approach may be implemented using any number of data signals, including a single data signal. For the most part, details concerning timing considerations and the like have been omitted where such details are not necessary to obtain a complete understanding of the disclosed approach, especially by one of ordinary skill in the art.

Those of ordinary skill in the art would appreciate that any of elements described in connection with the various aspects of the disclosed approach may be implemented as electronic hardware (e.g., a digital implementation, an analog implementation, or a combination of the two, which may be designed using source coding or some other technique); various forms of program or design code incorporating instructions, which may be referred to herein, for convenience, as "software" or a "software module"; or combinations of both. To better illustrate this interchangeability of hardware and software, the various illustrative elements have been described above generally in terms of their functionality. Whether such functionality is implemented as hardware or software depends upon the particular application and design constraints imposed on the overall system. Thus, those of ordinary skill in the art may implement the described functionality in varying ways for each particular application, and such implementation decisions should not be interpreted as causing a departure from the spirit of the disclosed approach.

Where any of the elements described herein is implemented as electronic hardware, it may be implemented as either an IC or a part of an IC. The IC may include a general purpose processor, a DSP, an ASIC, an FPGA or other programmable logic device, discrete gate or transistor logic, discrete hardware component, electrical component, optical component, mechanical component, or any combination thereof designed to perform the functions described herein. The general purpose processor may include a microprocessor or, in the alternative, the general purpose processor may be any conventional processor, controller, microcontroller, or state machine. In general, the IC may be configured as a combination of a variety of computing devices described herein, such as a combination of: a DSP and a microprocessor; a number of microprocessors; multiple microprocessors in conjunction with multiple DSPs; or any other such configuration.

To the extent any of the elements described herein is implemented as software that includes algorithmic codes or instructions, those of ordinary skill in the art would appreciate that the various electronic hardware described herein may be configured to operate using said software. For example, an IC may be configured to execute software that reside within the IC, outside of the IC, or both. As another, more specific example, an IC may implement a general purpose processor configured for executing software to perform the functions and operations described herein. As such, those of ordinary skill in the art should understand that any specific order or hierarchy of steps in any disclosed software operation executed by the general purpose processor is an example of a sample approach. Based upon design preferences, it may be preferable to utilize a special purpose processor to carry out various aspects of the disclosed approach. The accompanying method claims thus may include elements of the various steps in a sample order, and are not meant to be limited to the specific order or hierarchy presented unless otherwise stated.

The steps of a method or algorithm described in connection with the various aspects of the disclosed approach may be embodied directly in hardware, in a software module executed by a processor, or in a combination of the two. A software module (e.g., including executable instructions and related data), and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which is referred to herein, for convenience, as a "processor") such that the processor can both read information (e.g., code) from, and write information to, the storage medium. A sample storage medium may be integral to the processor. The processor and the storage medium may reside in an ASIC. The ASIC may reside in user equipment. In the alternative, the processor and the storage medium may reside as discrete components in user equipment. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

It should be understood that any references that has been made to elements using a designation such as "first," "second," "third," and so forth should not limit a quantity and/or order of those elements, unless any such limitation has been explicitly stated. Rather, these designations should be understood, as convention dictates, to distinguish between two or more elements and/or instances of an element. Thus, a reference to "first and second elements" does not mean that only two elements may be employed nor that the "first element" must precede the "second element" in some manner. In addition, unless stated otherwise, any reference to a "set of elements" should be understood to mean a collection of elements, which may mean an "empty set" where the collection includes zero elements.

The previous description is provided to enable any person skilled in the art to fully understand the full scope of the disclosure. Modifications to any configuration disclosed herein that remains in the spirit of the disclosed approach should be readily apparent to those of ordinary skill in the art. Thus, the claims are not intended to be limited to the specifics of the various aspects of the disclosure described herein, but are to be accorded the full scope consistent with the language of claims, wherein reference to an element in the singular is not intended to mean "one and only one" unless specifically so stated, but rather "one or more." Unless specifically stated otherwise, the term "some" refers to one or more. A claim that recites at least one of a combination of elements (e.g., "at least one of A, B, or C") refers to one or more of the recited elements (e.g., A, or B, or C, or any combination thereof). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

What is claimed is:

1. A sense amplifier comprising:
   an amplifier circuit configured to receive, at an input, an input signal comprising an input level generated based on a programmable device, the amplifier circuit configured to provide an amplified differential output signal comprising a gain with respect to the input level; and
   a feedback circuit coupled to receive the amplified differential output signal from the amplifier circuit, the feedback circuit configured to provide, at the input of the amplifier circuit, a an adjusted version of the amplified differential output signal comprising a modified output magnitude based on common mode feedback, wherein the feedback circuit is further configured to limit the modified output magnitude and reduce the input level of the input signal generated based on the programmable device.

2. The sense amplifier of claim 1, wherein the input level comprises a differential input based on a difference of determined values between the programmable device and a reference device.

3. A sense amplifier comprising:
   an amplifier circuit configured to receive, at an input, an input signal comprising an input level generated based on a programmable device, the amplifier circuit configured to provide an amplified differential output signal comprising a gain with respect to the input level, wherein the amplifier circuit further comprising a follower circuit configured to shift a supply voltage level provided to the amplifier circuit; and
   a feedback circuit coupled to receive the amplified differential output signal from the amplifier circuit, the feedback circuit configured to provide, at the input of the amplifier circuit, a an adjusted version of the amplified differential output signal comprising a modified output magnitude based on common mode feedback.

4. The sense amplifier of claim 3, wherein the follower circuit is configured to raise the supply voltage level.

5. A sense amplifier comprising:
   an amplifier circuit configured to receive, at an input, an input signal comprising an input level generated based on a programmable device, the amplifier circuit configured to provide an amplified differential output signal comprising a gain with respect to the input level; and
   a feedback circuit coupled to receive the amplified differential output signal from the amplifier circuit, the feedback circuit configured to provide, at the input of the amplifier circuit, a an adjusted version of the amplified differential output signal comprising a modified output magnitude based on common mode feedback, wherein the modified output magnitude comprises a threshold based on an operational characteristic of at least one device in the amplifier circuit coupled to the feedback circuit via a gate terminal of the at least one device.

6. The sense amplifier of claim 5, wherein the at least one device comprises a programmable fuse device coupled to the input of the amplifier circuit, the operational characteristic comprises a current through the programmable fuse device, and the feedback circuit further comprises a current-limited circuit configured to limit the current through the programmable fuse device.

7. A method comprising:
receiving, at an input of an amplifier circuit, an input signal having an input level generated based on a programmable device;
providing an amplified differential output signal comprising a gain with respect to the input level;
receiving the amplified differential output signal from the amplifier circuit at a feedback circuit; and
providing, to the input of the amplifier circuit, an adjusted version of the amplified differential output signal comprising a modified output magnitude based on common mode feedback, wherein the modified output magnitude is limited and the input level of the input signal generated is reduced based on the programmable device.

8. The method of claim 7, wherein the input level comprises a differential input based on a difference of determined values between the programmable device and a reference device.

9. A method comprising:
receiving, at an input of an amplifier circuit, an input signal having an input level generated based on a programmable device;
shifting a supply voltage level provided to the amplifier circuit;
providing an amplified differential output signal comprising a gain with respect to the input level;
receiving the amplified differential output signal from the amplifier circuit at a feedback circuit; and
providing, to the input of the amplifier circuit, an adjusted version of the amplified differential output signal comprising a modified output magnitude based on common mode feedback.

10. The method of claim 9, wherein the shifting of the supply voltage level comprises raising the supply voltage level.

11. A method comprising:
receiving, at an input of an amplifier circuit, an input signal having an input level generated based on a programmable device;
providing an amplified differential output signal comprising a gain with respect to the input level;
receiving the amplified differential output signal from the amplifier circuit at a feedback circuit; and
providing, to the input of the amplifier circuit, an adjusted version of the amplified differential output signal comprising a modified output magnitude based on common mode feedback, wherein the modified output magnitude comprises a threshold based on an operational characteristic of at least one device in the amplifier circuit coupled to the feedback circuit via a gate terminal of the at least one device.

12. The method of claim 11, wherein the at least one device comprises a programmable fuse device coupled to the input of the amplifier circuit, the operational characteristic comprises a current through the programmable fuse device, and the feedback circuit further comprises a current-limited circuit, the method further comprising limiting the current through the programmable fuse device.

13. A sense amplifier comprising:
means for receiving, at an input of an amplifier circuit, an input signal having an input level generated based on a programmable device;
means for providing an amplified differential output signal comprising a gain with respect to the input level;
means for receiving the amplified differential output signal from the amplifier circuit at a feedback circuit; and
means for providing, to the input of the amplifier circuit, an adjusted version of the amplified differential output signal comprising a modified output magnitude based on common mode feedback, wherein the modified output magnitude is limited and the input level of the input signal generated is reduced based on the programmable device.

14. The sense amplifier of claim 13, wherein the input level comprises a differential input based on a difference of determined values between the programmable device and a reference device.

15. A sense amplifier, comprising:
means for receiving, at an input of an amplifier circuit, an input signal having an input level generated based on a programmable device;
means for shifting a supply voltage level provided to the amplifier circuit;
means for providing an amplified differential output signal comprising a gain with respect to the input level;
means for receiving the amplified differential output signal from the amplifier circuit at a feedback circuit; and
means for providing, to the input of the amplifier circuit, an adjusted version of the amplified differential output signal comprising a modified output magnitude based on common mode feedback.

16. The sense amplifier of claim 15, wherein the means for shifting the supply voltage level comprises means for raising the supply voltage level.

17. A sense amplifier, comprising:
means for receiving, at an input of an amplifier circuit, an input signal having an input level generated based on a programmable device;
means for providing an amplified differential output signal comprising a gain with respect to the input level;
means for receiving the amplified differential output signal from the amplifier circuit at a feedback circuit; and
means for providing, to the input of the amplifier circuit, an adjusted version of the amplified differential output signal comprising a modified output magnitude based on common mode feedback, wherein the modified output magnitude comprises a threshold based on an operational characteristic of at least one device in the amplifier circuit coupled to the feedback circuit via a gate terminal of the at least one device.

18. The sense amplifier of claim 17, wherein the at least one device comprises a programmable fuse device coupled to the input of the amplifier circuit, the operational characteristic comprises a current through the programmable fuse device, and the feedback circuit further comprises means for limiting the current through the programmable fuse device.

* * * * *